(12) United States Patent
Kim

(10) Patent No.: US 9,035,274 B2
(45) Date of Patent: May 19, 2015

(54) SEMICONDUCTOR DEVICE HAVING A STACK STRUCTURE INCLUDING A STOICHIOMETRIC MATERIAL AND A NON-STOICHIOMETRIC MATERIAL, AND METHOD FOR FABRICATING THE SAME

(71) Applicant: SK HYNIX INC., Icheon (KR)

(72) Inventor: Beom-Yong Kim, Icheon (KR)

(73) Assignee: SK HYNIX INC., Icheon (KR)

( * ) Notice: Subject to any disclaimer, the term of this patent is extended or adjusted under 35 U.S.C. 154(b) by 7 days.

(21) Appl. No.: 13/945,834

(22) Filed: Jul. 18, 2013

(65) Prior Publication Data
US 2014/0299830 A1    Oct. 9, 2014

(30) Foreign Application Priority Data
Apr. 5, 2013    (KR) .................. 10-2013-0037372

(51) Int. Cl.
| | |
|---|---|
| *H01L 47/00* | (2006.01) |
| *H01L 45/00* | (2006.01) |
| *H01L 27/24* | (2006.01) |
| *G11C 13/00* | (2006.01) |

(52) U.S. Cl.
CPC ............ *H01L 45/08* (2013.01); *G11C 2213/30* (2013.01); *G11C 13/0002* (2013.01); *H01L 45/1233* (2013.01); *H01L 45/1266* (2013.01); *H01L 45/146* (2013.01); *H01L 45/1658* (2013.01); *H01L 27/2481* (2013.01)

(58) Field of Classification Search
None
See application file for complete search history.

(56) References Cited

U.S. PATENT DOCUMENTS

| | | | |
|---|---|---|---|
| 7,863,087 B1 | 1/2011 | Kumar et al. | |
| 8,502,343 B1 * | 8/2013 | Jha et al. | 257/537 |
| 2005/0082593 A1 * | 4/2005 | Lee et al. | 257/306 |
| 2008/0278990 A1 * | 11/2008 | Kumar et al. | 365/148 |
| 2009/0283736 A1 * | 11/2009 | Kanzawa et al. | 257/2 |
| 2011/0182103 A1 * | 7/2011 | Smythe et al. | 365/148 |

\* cited by examiner

*Primary Examiner* — Anders Munoz

(57) ABSTRACT

A method for fabricating a semiconductor device includes forming an impurity layer over a first conductive layer; forming a first metal oxide layer over the impurity layer, wherein the first metal oxide layer includes oxygen at a lower ratio than a stoichiometric ratio; diffusing an impurity from the impurity layer into the first metal oxide layer to form a first doped metal oxide layer; forming a second metal oxide layer over the first doped metal oxide layer; and forming a second conductive layer over the second metal oxide layer.

18 Claims, 18 Drawing Sheets

SEMICONDUCTOR DEVICE HAVING A STACK STRUCTURE INCLUDING A STOICHIOMETRIC MATERIAL AND A NON-STOICHIOMETRIC MATERIAL, AND METHOD FOR FABRICATING THE SAME

CROSS-REFERENCE TO RELATED APPLICATION

The present application claims priority of Korean Patent Application No. 10-2013-0037372, filed on Apr. 5, 2013, which is incorporated herein by reference in its entirety.

BACKGROUND

1. Field

Exemplary embodiments relate to a method for fabricating a semiconductor device, and more particularly to a method for fabricating a semiconductor device including a variable resistance layer which has resistance that is changed in accordance with a voltage or current applied thereto and can perform switching between at least two different resistance states.

2. Description of the Related Art

A variable resistance memory device is a device which stores data using the characteristics that the resistance of the memory device is changed in accordance with an external stimulus and the memory device can perform switching between at least two different resistance states, and may include a ReRAM (Resistive Random Access Memory), a PCRAM (Phase Change RAM), a STT-RAM (Spin Transfer Torque-RAM), and the like. In particular, since the variable resistance memory device can be formed with a simple structure and has superior characteristics, such as non-volatility, extensive researches for the variable resistance memory device have been made.

ReRAM has a structure which includes a variable resistance layer made of a variable resistance material, e.g., Perovskite material or a transition metal oxide and electrodes disposed over upper and lower portions of the variable resistance layer. In accordance with the voltage applied to the electrodes, a current path in the form of a filament is generated or disappears in the variable resistance layer. Accordingly, the variable resistance layer is at a low resistance state when the current path in form of a filament is generated, and is at a high resistance state when the current path in the form of a filament becomes disappeared.

SUMMARY

Various embodiments are directed to a method for fabricating a semiconductor device, which can improve resistance switching characteristics by preventing increase of electrical resistance of a metal oxide layer by doping an impurity into the metal oxide layer in advance although the metal oxide is oxidized in a fabricating process, and thus reliability and productivity can be improved.

In an embodiment, a method for fabricating a semiconductor device includes forming an impurity layer over a first conductive layer; forming a first metal oxide layer over the impurity layer, wherein the first metal oxide layer includes oxygen at a lower ratio than a stoichiometric ratio; diffusing an impurity from the impurity layer into the first metal oxide layer to form a first doped metal oxide layer; forming a second metal oxide layer over the first doped metal oxide layer; and forming a second conductive layer over the second metal oxide layer.

In an embodiment, a method for fabricating a semiconductor device includes forming a first metal oxide layer over a first conductive layer; forming a second metal oxide layer, having oxygen at a lower ratio than a stoichiometric ratio, over the first metal oxide layer; forming a second conductive layer over the second metal oxide layer; forming an impurity layer over the second conductive layer; forming a third metal oxide layer, having oxygen at a lower ratio than a stoichiometric ratio, over the impurity layer; diffusing an impurity from the impurity layer into the third metal oxide layer; forming a fourth metal oxide layer over the third metal oxide layer; and forming a third conductive layer over the fourth metal oxide layer.

In an embodiment, a method for fabricating a semiconductor device includes forming an impurity layer over a first electrode layer; forming a non-stoichiometric material layer over the impurity layer; diffusing impurities from the impurity layer into the non-stoichiometric material layer to form a doped non-stoichiometric material layer; forming a stoichiometric material layer over the doped non-stoichiometric material layer; and forming a second electrode layer over the stoichiometric material layer.

In an embodiment, a semiconductor device includes a first conductive layer; a first metal oxide layer doped with an impurity, wherein the first metal oxide layer include oxygen at a lower ratio than a stoichiometric ratio and disposed over the first conductive layer; a second metal oxide layer disposed over the first metal oxide layer; and a second conductive layer disposed over the second metal oxide layer.

In an embodiment, a semiconductor device includes a first conductive layer; a first metal oxide layer disposed over the first conductive layer; a second metal oxide layer which includes oxygen at a lower ratio than a stoichiometric ratio and is disposed over the first metal oxide layer; a second conductive layer disposed over the second metal oxide layer; a third metal oxide layer doped with an impurity, wherein the third metal oxide layer includes oxygen at a lower ratio than a stoichiometric ratio and is disposed over the second conductive layer; a fourth metal oxide layer disposed over the third metal oxide layer; and a third conductive layer disposed over the fourth metal oxide layer.

In an embodiment, a semiconductor device includes a first electrode layer; a non-stoichiometric material layer which is doped with an impurity and is disposed over the first electrode layer; a stoichiometric material layer disposed over the non-stoichiometric material layer; and a second electrode layer disposed over the stoichiometric material layer.

In an embodiment, an electronic device includes a variable resistance memory device configured to store data and maintain the stored data regardless of power supply; and a memory controller configured to control input/output of the data stored in the variable resistance memory device according to a command inputted from outside, wherein the variable resistance memory device comprises: a first conductive layer; a first metal oxide layer doped with an impurity, wherein the first metal oxide layer include oxygen at a lower ratio than a stoichiometric ratio and disposed over the first conductive layer; a second metal oxide layer disposed over the first metal oxide layer; and a second conductive layer disposed over the second metal oxide layers

DETAILED DESCRIPTION

Figure 1A:
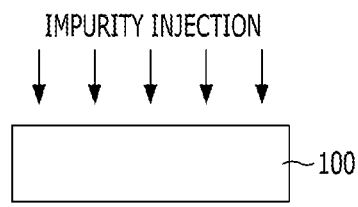
FIGS. 1A to 1F are cross-sectional views illustrating a method for fabricating a semiconductor device according to a first embodiment.

Various embodiments will be described below in more detail with reference to the accompanying drawings. The drawings are not necessarily to scale and in some instances, proportions may have been exaggerated in order to clearly illustrate features of the embodiments. The embodiments may, however, be in different forms and should not be construed as limiting. Throughout the disclosure, like reference numerals refer to like parts throughout the various figures and embodiments.

FIGS. 1A to 1F are cross-sectional views illustrating a method for fabricating a semiconductor device according to a first embodiment.

Referring to FIG. 1A, a first conductive layer 100 is formed on a substrate (not illustrated) having a predetermined lower structure. The substrate may be based on a silicon (Si) substrate, a germanium (Ge) substrate, a silicon-germanium (SiGe) substrate, or a SOI (Silicon-On-Insulator) substrate. Although not illustrated in the cross-sectional view, peripheral circuit elements for driving the semiconductor device may be included.

Here, the first conductive layer 100 may be a film including (i) metal, such as tantalum (Ta), titanium (Ti), ruthenium (Ru), hafnium (Hf), zirconium (Zr), aluminum (Al), tungsten (W), copper (Cu), gold (Au), silver (Ag), platinum (Pt), nickel (Ni), chrome (Cr), and cobalt (Co), or (ii) metal nitride, such as titanium nitride (TiN), tantalum nitride (TaN), and tungsten nitride (WN), or (iii) a multi-layered film of a combination thereof. The first conductive layer 100 may be formed through deposition with a thickness of 50 nm to 100 nm by atomic layer deposition (ALD), chemical vapor deposition (CVD), or physical vapor deposition (PVD).

Then, through an ion implantation process, an impurity is implanted into an upper portion of the first conductive layer 100. For example, at least one of arsenide (As), phosphorus (P), boron (B), nitrogen (N), germanium (Ge), titanium (Ti), and tantalum (Ta) may be implanted with ion implantation energy of about 2 keV to about 6 keV and with a dose of about $1 \times 10^{15}$ ions/cm$^2$ to about $8 \times 10^{15}$ ions/cm$^2$. In particular, resistance switching characteristics can be adjusted through adjustment of the ion implantation energy and the dose, and in this process, the impurity may be implanted into a lower portion of the first conductive layer 100.

Figure 1B:

Referring to FIG. 1B, an impurity layer 110 may be formed on the first conductive layer 100 as the result of the ion implantation process. The impurity layer 110 is for doping the first metal oxide layer by diffusion with impurities as described later. Through this, physical damage, which occurs when the impurity is directly implanted into a metal oxide layer, can be prevented. The impurity layer 110 may include at least one of arsenide (As), phosphorus (P), boron (B), nitrogen (N), germanium (Ge), titanium (Ti), and tantalum (Ta) implanted by the above-described process.

Figure 1C:
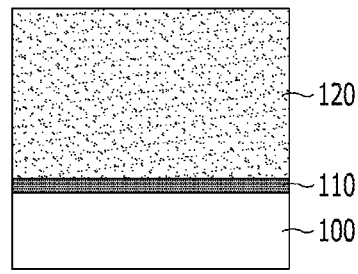

Referring to FIG. 1C, a first metal oxide layer 120 (or non-stoichiometric material layer) is formed on the impurity layer 110. The first metal oxide layer 120 may include (i) a Perovskite material of which the electrical resistance is changed according to oxygen vacancy or ion migration, (ii) transition metal oxide (TMO), such as titanium (Ti) oxide, hafnium (Hf) oxide, zirconium (Zr) oxide, aluminum (Al) oxide, tantalum (Ta) oxide, niobium (Nb) oxide, cobalt (Co) oxide, nickel (Ni) oxide, tungsten (W) oxide, and lanthanum (La) oxide, or (iii) both. For example, the first metal oxide layer 120 may be an oxygen-deficient metal oxide material which has oxygen at a lower ratio than a stoichiometric ratio. Therefore oxygen vacancies or metal ions may excessively exist in the first metal oxide layer 120.

However, the first metal oxide layer 120 is not limited to metal oxide. Any non-stoichiometric material may be employed as the first metal oxide layer 120.

The first metal oxide layer 120 may be formed through deposition with a thickness of, for example, about 10 nm to about 50 nm by atomic layer deposition (ALD) or chemical vapor deposition (CVD).

Figure 1D:
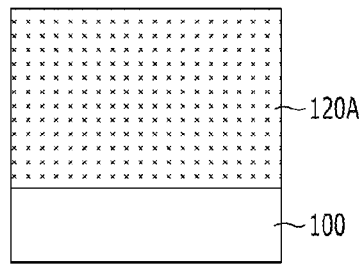

Referring to FIG. 1D, the impurity that is included in the impurity layer 110 is diffused into the first metal oxide layer 120. The impurity of the impurity layer 110 may be diffused by heat treatment performed in a following process. In order to expedite diffusion of the impurity, the heat treatment process may be additionally performed in nitrogen (N$_2$) atmosphere at a temperature of equal to or lower than about 400 degrees Celsius (° C.). A second metal oxide layer may be on the first metal oxide layer 120 which satisfies a stoichiometry ratio. The first metal oxide layer 120 may be oxidized while the second metal oxide layer is formed. Thus, resistance of the first metal oxide layer 120 increases, thereby deteriorating device switching characteristics. However, in the embodiment, the impurity is doped into the first metal oxide layer 120 in advance so as to offset increase of resistance of the first metal oxide layer 120 in the subsequent process. As a result of the diffusion process, the impurity layer 110 may be integrated to the first metal oxide layer 120, resulting in a first doped metal oxide layer 120A. In the first doped metal oxide layer 120A, concentration of the impurity decreases as a distance from the first conductive layer 100 increases.

Figure 1E:
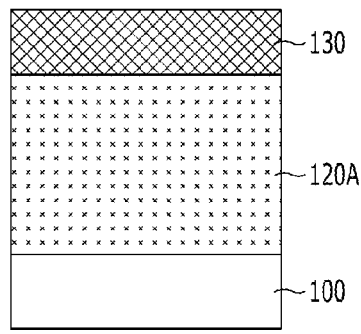

Referring to FIG. 1E, a second metal oxide layer 130 (or stoichiometric material layer) is formed on the first doped metal oxide layer 120A. The second metal oxide layer 130 may include (i) a Perovskite material, of which the electrical resistance is changed according to oxygen vacancy or ion migration, (ii) transition metal oxide (TMO), such as titanium (Ti) oxide, hafnium (Hf) oxide, zirconium (Zr) oxide, aluminum (Al) oxide, tantalum (Ta) oxide, niobium (Nb) oxide, cobalt (Co) oxide, nickel (Ni) oxide, tungsten (W) oxide, and lanthanum (La) oxide, or (iii) both. In particular, the second metal oxide layer 130 maybe a material which satisfies a stoichiometry ratio. The second metal oxide layer 130 may have a resistance value that is changed according to an applied voltage or current and perform switching between at least two different resistance states. The second metal oxide layer 130 may be formed through deposition with a thickness of, for example, 5 nm to 10 nm by atomic layer deposition (ALD) or chemical vapor deposition (CVD).

Here, when the second metal oxide layer 130, which satisfies a stoichiometry ratio, is formed on the first doped metal oxide layer 120A which is an oxygen-deficient material, the first doped metal oxide layer 120A may be oxidized. However, resistance of the first doped metal oxide layer 120A may be kept at a relatively low level due to its oxygen-deficiency property which is created by diffusion of the pre-doped impurity. Accordingly, the second metal oxide layer 130 may have a resistance value that is higher than the resistance value of the first doped metal oxide layer 120A.

Figure 1F:
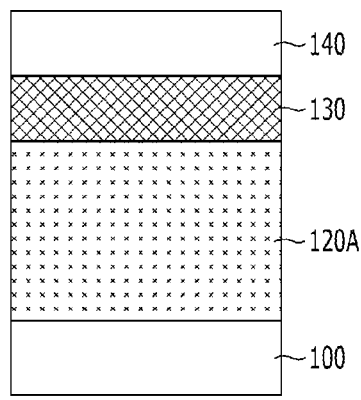

Referring to FIG. 1F, a second conductive layer 140 is formed on the second metal oxide layer 130. The second conductive layer 140 may be a film including (i) metal, such as tantalum (Ta), titanium (Ti), ruthenium (Ru), hafnium (Hf), zirconium (Zr), aluminum (Al), tungsten (W), copper (Cu), gold (Au), silver (Ag), platinum (Pt), nickel (Ni), chrome (Cr), and cobalt (Co), (ii) metal nitride, such as titanium nitride (TiN), tantalum nitride (TaN), and tungsten nitride (WN), or (iii) a multi-layered film of a combination thereof. On the other hand, the second conductive layer 100 may be formed through deposition with a thickness of, for example, 50 nm to 100 nm by atomic layer deposition (ALD), chemical vapor deposition (CVD), or physical vapor deposition (PVD).

Figure 10:
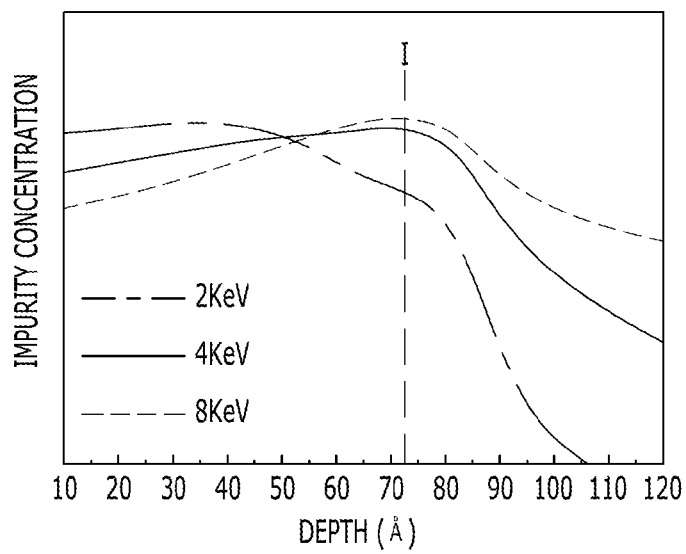
FIG. 10 is a graph illustrating impurity concentrations in accordance with depths from a surface of a buffer layer.

FIGS. 2A to 2E are cross-sectional views illustrating a method for fabricating a semiconductor device according to a second embodiment. FIG. 10 is a graph of impurity concentrations according to depth from a surface of a buffer layer. In explaining this second embodiment, the detailed explanation of portions on substantially the same elements as those according to the first embodiment as described above will be omitted.

Figure 2A:
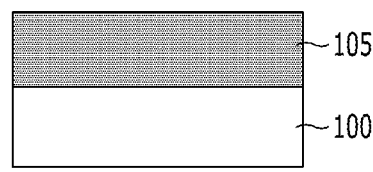
FIGS. 2A to 2E are cross-sectional views illustrating a method for fabricating a semiconductor device according to a second embodiment.

Referring to FIG. 2A, a buffer layer 105 is formed on the first conductive layer 100. The first conductive layer 100 may be formed using metal or metal nitride to a thickness of, for example, about 50 nm to 100 nm, e.g., by deposition such as atomic layer deposition (ALD), chemical vapor deposition (CVD), and physical vapor deposition (PVD). For example, the buffer layer 105 may be formed by depositing silicon (Si) or silicon oxide ($SiO_2$) to a thickness of, for example, about 5 nm to about 10 nm.

Figure 2B:
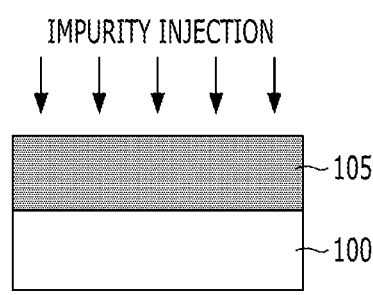

Referring to FIG. 2B, through an ion implantation process, an impurity is implanted into an upper portion of the first conductive layer 100. In this case, arsenide (As), phosphorus (P), boron (B), nitrogen (N), germanium (Ge), titanium (Ti), tantalum (Ta), or a combination thereof may be used. Implantation may be performed with ion implantation energy of about 2 KeV to 6 KeV and with a dose of about $1\times10^{15}$ ions/$cm^2$ to $8\times10^{15}$ ions/$cm^2$. In particular, by implanting the impurity through the buffer layer 105, an implantation depth can be more easily controlled. For example, implantation depth of impurities may be mainly distributed on an upper portion of the first conductive layer 100, i.e., in the neighborhood of an interface I between the first conductive layer 100 and the buffer layer 105 (see FIG. 10). On the other hand, respective graphs in FIG. 10 are obtained through different ion implantation energies (2 KeV, 4 KeV, and 8 KeV). As the ion implantation energy becomes stronger, the impurity exhibits a tendency to be deeply implanted.

Figure 2C:

Referring to FIG. 2C, the buffer layer 105 is removed through a wet etching process. The impurity layer 110 may be formed on the first conductive layer 100 as the result of the ion implantation process. The impurity layer 110 serves as an impurity source for doping a first metal oxide layer, which will be formed in a subsequent process, by diffusion. The impurity layer 110 may include arsenide (As), phosphorus (P), boron (B), nitrogen (N), germanium (Ge), titanium (Ti), tantalum (Ta), or a combination thereof.

Figure 2D:
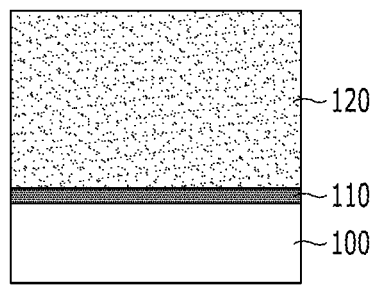

Referring to FIG. 2D, a first metal oxide layer 120 (or non-stoichiometric material layer) is formed on the impurity layer 110. The first metal oxide layer 120 may include (i) a Perovskite series material of which the electrical resistance is changed according to oxygen vacancy or ion migration, (ii) transition metal oxide (TMO), or (iii) both. The first metal oxide layer 120 may be formed through deposition to a thickness of, for example, about 10 nm to about 50 nm by atomic layer deposition (ALD) or chemical vapor deposition (CVD). The first metal oxide layer 120 may be configured as an oxygen-deficient material so that its oxygen ratio does not satisfy its stoichiometry ratio.

Figure 2E:
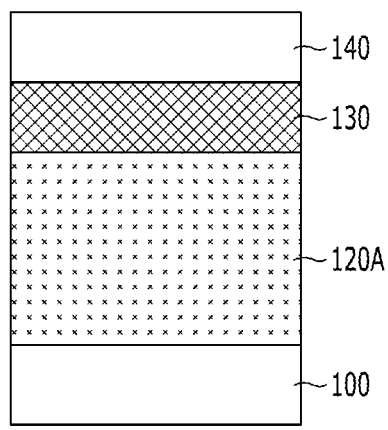

Referring to FIG. 2E, the impurity that is included in the impurity layer 110 is diffused into the first metal oxide layer 120. The impurity of the impurity layer 110 may be diffused by heat treatment performed in the following process. In order to expedite the diffusion of the impurity, the heat treatment process may be performed in nitrogen ($N_2$) atmosphere at a temperature of equal to or lower than about 400 degrees Celsius (° C.). As a result of the process, the impurity layer 110 may be integrated with the first metal oxide layer 120, resulting in a first doped metal oxide layer 120A.

Then, a second metal oxide layer 130 (or stoichiometric material layer) and a second conductive layer 140 are sequentially formed on the first doped metal oxide layer 120A. The second metal oxide layer 130 may include (i) a Perovskite series material, of which the electrical resistance is changed according to oxygen vacancy or ion migration, (ii) transition metal oxide (TMO), or (iii) both. The second metal oxide layer 130 may be configured to satisfy a stoichiometry ratio in an oxygen ratio. The second conductive layer 140 may be formed through deposition to a thickness of, for example, 5 nm to 10 nm, for example, by atomic layer deposition (ALD) or chemical vapor deposition (CVD). For example, the second conductive layer 140 may be formed by depositing metal or metal nitride to a thickness of, for example, 50 nm to 100 nm by atomic layer deposition (ALD), chemical vapor deposition (CVD), or physical vapor deposition (PVD).

FIGS. 3A to 3D are cross-sectional views illustrating a method for fabricating a semiconductor device according to a third embodiment. In explaining this embodiment, the detailed explanation on substantially the same elements as those described in the first embodiment will be omitted.

Figure 3A:
FIGS. 3A to 3D are cross-sectional views illustrating a method for fabricating a semiconductor device according to a third embodiment.

Referring to FIG. 3A, a doped silicon layer 115 is formed on the first conductive layer 100. The first conductive layer 100 may be formed through deposition of metal or metal nitride to a thickness of, for example, about 50 nm to about 100 nm by atomic layer deposition (ALD), chemical vapor deposition (CVD), or physical vapor deposition (PVD). The doped silicon layer 115 may be formed through deposition of polysilicon doped with arsenide (As), phosphorus (P), boron (B), nitrogen (N), germanium (Ge), titanium (Ti), tantalum (Ta), or a combination thereof. The implantation may be performed at ion implantation energy of about 2 keV to about 6 keV and using a dose equal to or more than about $1\times10^{20}$ ions/cm$^2$.

Figure 3B:
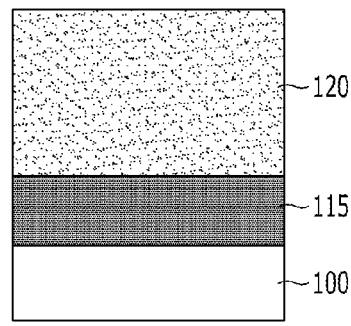

Referring to FIG. 3B, a first metal oxide layer 120 (or non-stoichiometric material layer) is formed on the doped silicon layer 115. The first metal oxide layer 120 may include (i) a Perovskite material of which the electrical resistance is changed according to oxygen vacancy or ion migration, (ii) transition metal oxide (TMO), or (iii) both. The first metal oxide layer 120 may be formed through deposition to a thickness of, for example, 10 nm to 50 nm by atomic layer deposition (ALD) or chemical vapor deposition (CVD) The first metal oxide layer 120 may be configured as an oxygen-deficient material whose oxygen ratio does not satisfies a stoichiometry ratio.

Figure 3C:
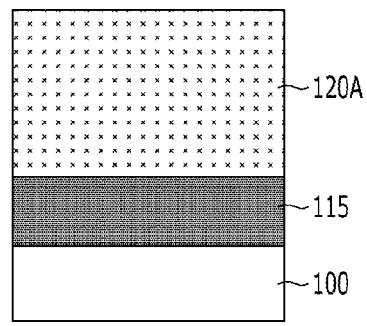

Referring to FIG. 3C, the impurity that is included in the doped silicon layer 115 is diffused into the first metal oxide layer 120. The impurity of the doped silicon layer 115 may be diffused by heat treatment performed in the following process. In order to expedite the diffusion of the impurity, a heat treatment process may be performed in nitrogen (N$_2$) atmosphere at a temperature of equal to or lower than 400 degrees Celsius (° C.). Since the doped silicon layer 115 has conductivity, it is not required to remove the doped silicon layer 115, and thus the process can be simplified compared to the second embodiment. The first metal oxide layer 120 doped with the impurity is hereafter referenced as a first doped metal layer 120A.

Figure 3D:
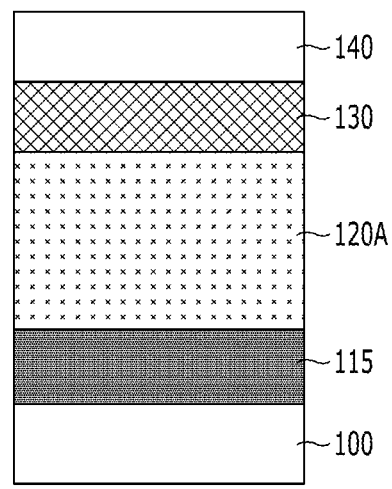

Referring to FIG. 3D, a second metal oxide layer 130 (or stoichiometric material layer) and a second conductive layer 140 are sequentially formed on the first doped metal oxide layer 120A. The second metal oxide layer 130 may include (i) a Perovskite material, of which the electrical resistance is changed according to oxygen vacancy or ion migration, (ii) transition metal oxide (TMO), or (iii) both. The second metal oxide layer 130 may be configured to satisfy a stoichiometry ratio. The second metal oxide layer 130 may be formed through deposition to a thickness of, for example, about 5 nm to about 10 nm by atomic layer deposition (ALD) or chemical vapor deposition (CVD). Further, the second conductive layer 140 may be formed by depositing metal and/or metal nitride to a thickness of, for example, about 50 nm to about 100 nm by atomic layer deposition (ALD), chemical vapor deposition (CVD), or physical vapor deposition (PVD).

Figure 4:
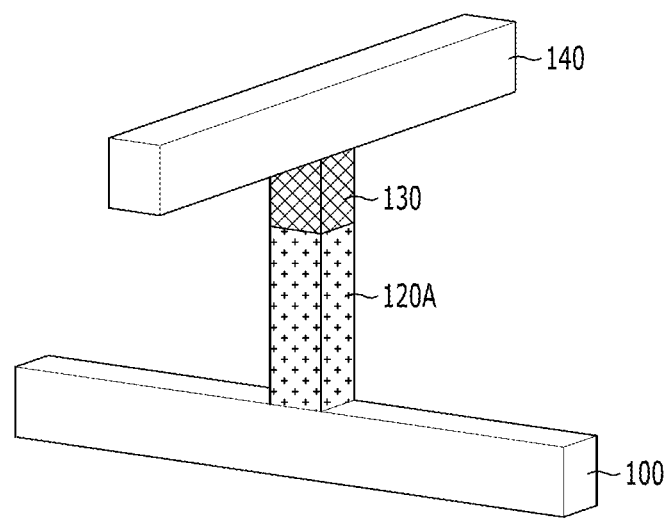
FIG. 4 is a perspective view illustrating a semiconductor device according to an embodiment.
Figure 11:
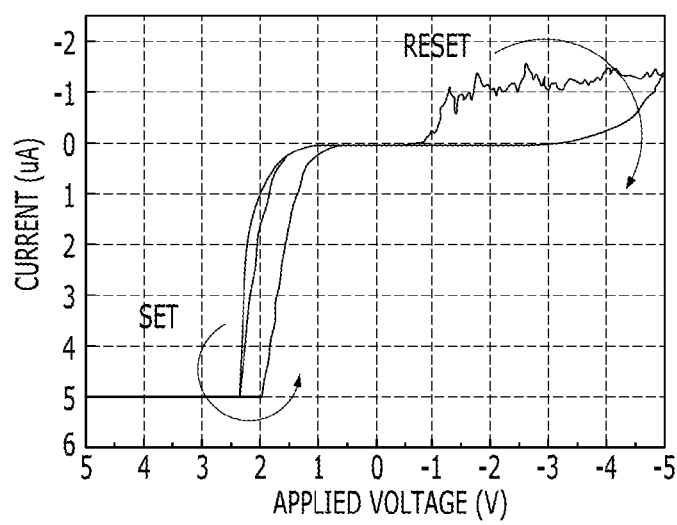
FIG. 11 is a graph illustrating resistance switching characteristics of a semiconductor device according to an embodiment.

FIG. 4 is a perspective view illustrating a semiconductor device according to an embodiment. FIG. 11 is a graph illustrating resistance switching characteristics of a semiconductor device according to an embodiment.

Referring to FIG. 4, a first conductive layer 100 of a semiconductor device according to an embodiment of may extend in one direction, and a second conductive layer 140 may extend in a direction that crosses the first conductive layer 100. Even though the particular embodiment of FIG. 4 shows a single second conductive layer 140, a plurality of first conductive layers 100 may be arranged in parallel to each other. Likewise, a plurality of second conductive layers 140 may be arranged in parallel to each other. A first doped metal oxide layer 120A and a second dope metal oxide layer 130 may be arranged between the first conductive layers 100 and the second conductive layers 140 at respective cross points of the first conductive layers 100 and the second conductive layers to form a cross point cell array.

Here, when a voltage is applied between the first conductive layer 100 and the second conductive layer 140, a voltage applied to the second metal oxide layer 130 is higher than a voltage applied to the first doped metal oxide layer 120A. This is because the second metal oxide layer 130 has a higher resistance value than a resistance value of the first doped metal oxide layer 120A. That is, a majority of the applied voltage is applied to the second metal oxide layer 130. Thus, the resistance switching operation is substantially and primarily performed by the second metal oxide layer 130. As a result, switching characteristics, such as nonlinearity, can be improved even when a switching current is reduced to a level of about 5 µA (see FIG. 11). In FIG. 11, "SET" denotes a switching operation from a high resistance state to a low resistance state, and "RESET" denotes a switching operation from the low resistance state to the high resistance state.

FIGS. 5A to 5F are cross-sectional views illustrating a method for fabricating a semiconductor device according to a fourth embodiment.

Figure 5A:
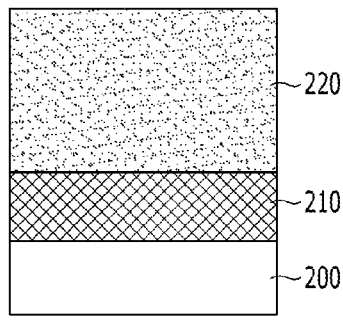
FIGS. 5A to 5F are cross-sectional views illustrating a method for fabricating a semiconductor device according to a fourth embodiment.

Referring to FIG. 5A, a first conductive layer 200 is formed on a substrate (not illustrated) having a predetermined lower structure, such as peripheral circuit elements for driving the semiconductor device. The substrate may be based on a silicon substrate, a germanium substrate, a silicon-germanium substrate, or a SOI (Silicon-On-Insulator) substrate. Further, the first conductive layer 200 may be a single film including metal or metal nitride or a multi-film of a combination thereof. On the other hand, the first conductive layer 200 may be formed through deposition to a thickness of 50 nm to 100 nm by atomic layer deposition (ALD), chemical vapor deposition (CVD), or physical vapor deposition (PVD).

Then, a first metal oxide layer 210 (or first stoichiometric material layer) is formed on the first conductive layer 200. The first metal oxide layer 210 may include, for example, (i) a Perovskite series material, of which the electrical resistance is changed according to oxygen vacancy or ion movement, (ii) transition metal oxide (TMO), or (iii) a combination thereof. In particular, the first metal oxide layer 210 may have a material which satisfies a stoichiometry ratio, and may have a resistance value that is changed according to an applied voltage or current so that it performs a switching function between at least two different resistance states. On the other hand, the first metal oxide layer 210 may have a high resistance value than a resistance value of a second metal oxide layer which will be formed later, and may be formed through deposition to a thickness of, for example, 5 nm to 10 nm by atomic layer deposition (ALD) or chemical vapor deposition (CVD).

Then, the second metal oxide layer 220 (or first non-stoichiometric material layer) is formed on the first metal oxide layer 210. The second metal oxide layer 220 may include, for example, (i) a Perovskite series material, of which the electrical resistance is changed according to oxygen vacancy or ion movement, (ii) transition metal oxide (TMO), or (iii) both. Further, the second metal oxide layer 220 may be configured to be an oxygen-deficient material whose oxygen ratio does not satisfy its stoichiometry ratio. That is, oxygen vacancy or metal ions may excessively exist in the second metal oxide layer 220. The second metal oxide layer 220 may be formed through deposition to a thickness of, for example, 10 nm to 50 nm by atomic layer deposition (ALD) or chemical vapor deposition (CVD).

Figure 5B:
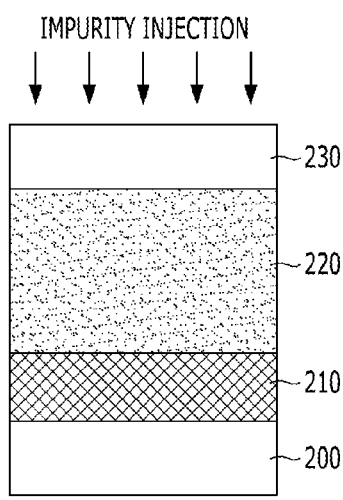

Referring to FIG. 5B, a second conductive layer 230 is formed on the second metal oxide layer 220. The second conductive layer 230 may be a single film including metal or metal nitride, or a multi-film composed of a combination thereof. On the other hand, the second conductive layer 230 may be formed through deposition with a thickness of, for example, 50 nm to 100 nm by atomic layer deposition (ALD), chemical vapor deposition (CVD), or physical vapor deposition (PVD).

Then, through an ion implantation process, an impurity is implanted into an upper portion of the second conductive layer 230. In this case, at least one of arsenide (As), phosphorus (P), boron (B), nitrogen (N), germanium (Ge), titanium (Ti), and tantalum (Ta) may be implanted with ion implantation energy of 2 KeV to 6 KeV and with a dose of $1 \times 10^{15}$ ions/cm$^2$ to $8 \times 10^{15}$ ions/cm$^2$. In particular, by adjusting the ion implantation energy and the dose, the resistance switching characteristics can be easily adjusted. In this process, the impurity may be also implanted into a lower portion of the second conductive layer 230.

Figure 5C:
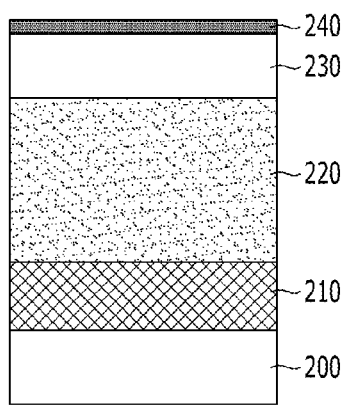

Referring to FIG. 5C, as the result of the ion implantation process, an impurity layer 240 may be formed on the second conductive layer 230. The impurity layer 240. The impurity layer 240 is for doping the impurity through diffusion into a third metal oxide layer which will be described later. Through this, physical damage, which might occur if the impurity was directly implanted onto the first metal oxide layer, can be prevented. The impurity layer 240 may include arsenide (As), phosphorus (P), boron (B), nitrogen (N), germanium (Ge), titanium (Ti), tantalum (Ta), or a combination thereof. The impurities may be implanted according to the above-described process.

Figure 5D:
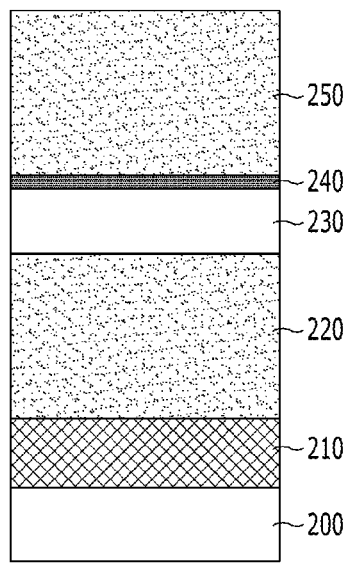

Referring to FIG. 5D, the third metal oxide layer 250 (or second non-stoichiometric material layer) is formed on the impurity layer 240. The third metal oxide layer 250 may include, for example, (i) a Perovskite material, of which the electrical resistance is changed according to oxygen vacancy or ion movement, (ii) transition metal oxide (TMO), or (iii) both. In particular, the third metal oxide layer 250 may be formed to have an oxygen-deficient material whose oxygen ratio does not satisfy its stoichiometry ratio. Thus, in the third metal oxide layer 250, an excess of oxygen vacancies and/or metal ions may exist. The third metal oxide layer 250 may be formed through deposition to a thickness of, for example, about 10 nm to 50 nm by atomic layer deposition (ALD) or chemical vapor deposition (CVD).

Figure 5E:
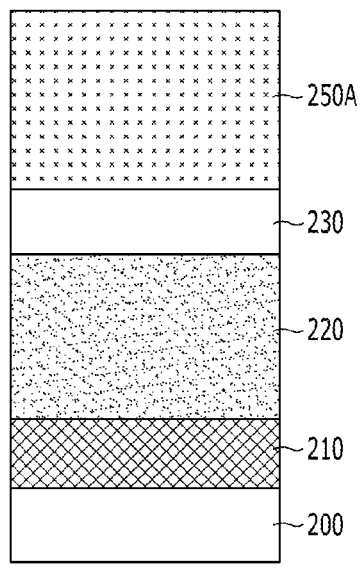

Referring to FIG. 5E, the impurity that is included in the impurity layer 240 is diffused into the third metal oxide layer 250. The impurity of the impurity layer 240 may be diffused by heat generated in the following process. In order to expedite the diffusion of the impurity, a heat treatment process may be additionally performed in nitrogen ($N_2$) atmosphere at a temperature of equal to or lower than 400° C. In particular, in forming a fourth metal oxide layer which will be described later, the third metal oxide layer 250 may be oxidized and thus its resistance may increase. As a result, its resistance switching characteristics may deteriorate as well. However, by doping the impurity into the third metal oxide layer 250 in advance, the increase of the resistance of the third metal oxide layer 250 may be offset. As the result of the process, the impurity layer 240 may naturally become integrated with the third metal oxide layer 250 to form a third doped metal oxide layer 250A. In the third doped metal oxide layer 250A, concentration of the impurity decreases as a distance from the second conductive layer 230 increases.

Figure 5F:
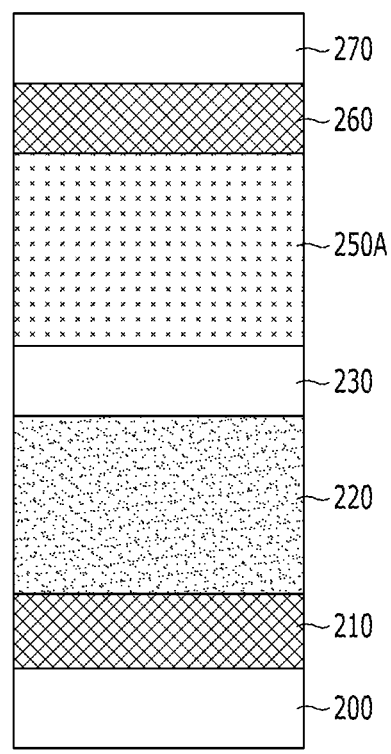

Referring to FIG. 5F, the fourth metal oxide layer 260 (or second stoichiometric material layer) is formed on the third doped metal oxide layer 250A. The fourth metal oxide layer 260 may include, for example, (i) a Perovskite material, of which the electrical resistance is changed according to oxygen vacancy or ion movement, (ii) transition metal oxide (TMO), or (iii) both. In particular, the fourth metal oxide layer 260 may a material satisfying a stoichiometry ratio, and may have a resistance value that is changed according to an applied voltage or current so as to perform switching between two or more different resistance states. On the other hand, the fourth metal oxide layer 260 may be formed through deposition with a thickness of, for example, 5 nm to 10 nm by atomic layer deposition (ALD) or chemical vapor deposition (CVD).

Here, when the fourth metal oxide layer 260, which satisfies a stoichiometry ratio, is formed on the third doped metal oxide layer 250A, (which is an oxygen-deficient material), the third doped metal oxide layer 250A may be oxidized. However, the third doped metal oxide layer 250A may still maintain a low resistance due to the pre-doped impurity. Accordingly, the fourth metal oxide layer 260 may have a resistance value that is higher than the resistance value of the third doped metal oxide layer 250A.

Then, a third conductive layer 270 is formed on the fourth metal oxide layer 260. The third conductive layer 270 may be a single film including metal or metal nitride, or a multi-film including a combination thereof. The third conductive layer 270 may be formed through deposition with a thickness of, for example, about 50 nm to about 100 nm by atomic layer deposition (ALD), chemical vapor deposition (CVD), or physical vapor deposition (PVD).

Figure 6A:
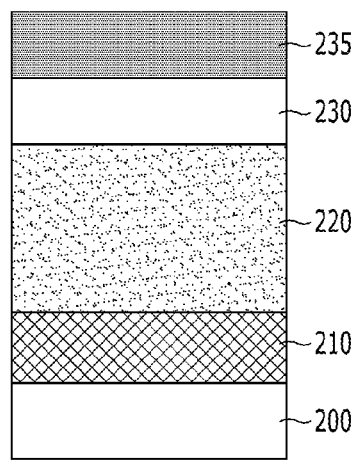
FIGS. 6A to 6E are cross-sectional views illustrating a method for fabricating a semiconductor device according to a fifth embodiment.

FIGS. 6A to 6E are cross-sectional views illustrating a method for fabricating a semiconductor device according to a fifth embodiment. In explaining this embodiment, the detailed explanation on substantially the same elements as those according to the fourth embodiment as described above will be omitted. First, after the process shown in FIG. 5A is performed in the same manner as the fourth embodiment, a process of FIG. 6A is performed.

Referring to FIG. 6A, after the second conductive layer 230 is formed on the second metal oxide layer 220 (or first non-stoichiometric material layer), a buffer layer 235 is formed on the second conductive layer 230. The second conductive layer 230 may be formed through deposition of, for example, metal or metal nitride to a thickness of, for example, about 50 nm to about 100 nm by atomic layer deposition (ALD), chemical vapor deposition (CVD), or physical vapor deposition (PVD). The buffer layer 235 may be formed through deposition of, for example, silicon (Si) or silicon oxide ($SiO_2$) to a thickness of, for example, about 5 nm to about 10 nm.

Figure 6B:
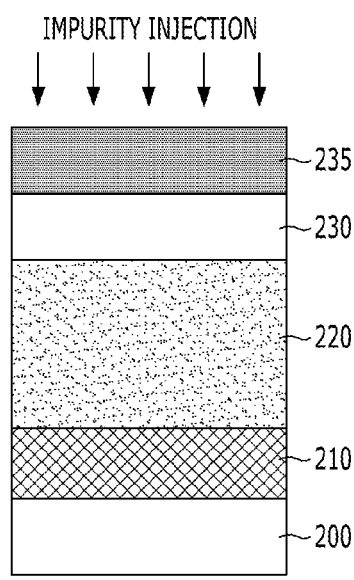

Referring to FIG. 6B, through an ion implantation process, an impurity is implanted into an upper portion of the second conductive layer 230. In this case, arsenide (As), phosphorus (P), boron (B), nitrogen (N), germanium (Ge), titanium (Ti), and tantalum (Ta), or a combination thereof may be implanted with ion implantation energy of about 2 KeV to about 6 KeV and with a dose of about $1 \times 10^{15}$ ions/cm$^2$ to about $8 \times 10^{15}$ ions/cm$^2$. In particular, by implanting the impurity through the buffer layer 235, the injected impurity may be mainly distributed on an upper portion of the second conductive layer 230, i.e., in the neighborhood of an interface (I) between the second conductive layer 230 and the buffer layer 235 (see FIG. 10).

Figure 6C:
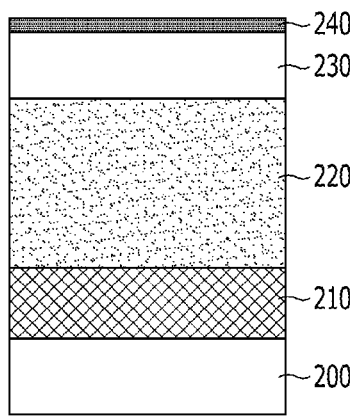

Referring to FIG. 6C, the buffer layer 235 is removed, for example, through performing a wet etching process. On the other hand, an impurity layer 240 may be formed on the second conductive layer 230 as the result of the ion implantation process. The impurity layer 240 is for doping the impurity through diffusion into the third metal oxide layer which will be described later, and may include any of arsenide (As), phosphorus (P), boron (B), nitrogen (N), germanium (Ge), titanium (Ti), tantalum (Ta), and the like.

Figure 6D:
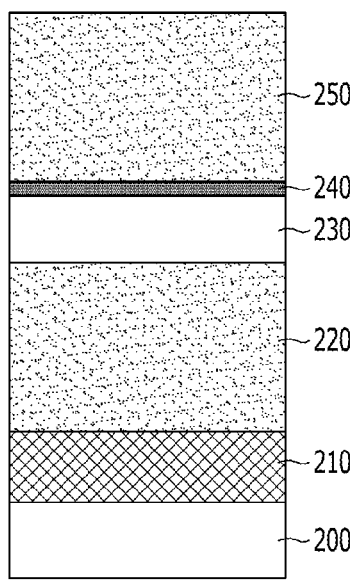

Referring to FIG. 6D, a third metal oxide layer 250 (or second non-stoichiometric material layer) is formed on the impurity layer 240. The third metal oxide layer 250 may include, for example, (i) a Perovskite material, of which the electrical resistance is changed according to oxygen vacancy or ion movement, (ii) transition metal oxide (TMO), or (iii)

both. On the other hand, the third metal oxide layer 250 may be formed through deposition to a thickness of, for example, about 10 nm to about 50 nm by atomic layer deposition (ALD) or chemical vapor deposition (CVD), and may be an oxygen-deficient material.

Figure 6E:
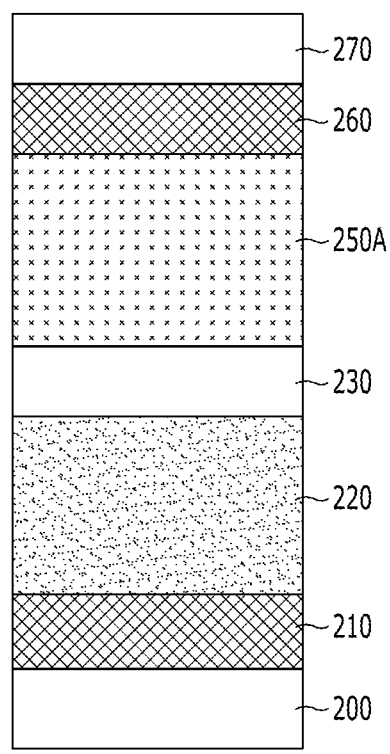

Referring to FIG. 6E, the impurity that is included in the impurity layer 240 is diffused into the third metal oxide layer 250. The impurity of the impurity layer 240 may be diffused by heat generated in the following process. In order to expedite the diffusion of the impurity, a heat treatment process may be additionally performed in nitrogen ($N_2$) atmosphere at a temperature of equal to or lower than 400° C. On the other hand, as the result of the process, the impurity layer 240 may become integrated with the third metal oxide layer 250 to form a third doped metal oxide layer 250A.

Then, a fourth metal oxide layer 260 (or second stoichiometric material layer) and a third conductive layer 270 are sequentially formed on the third doped metal oxide layer 250A. The fourth metal oxide layer 260 may include, for example, (i) a Perovskite material, of which the electrical resistance is changed according to oxygen vacancy or ion movement, (ii) transition metal oxide (TMO), or (iii) both. The fourth metal oxide layer 260 may have a material satisfying a stoichiometry ratio. The fourth conductive layer 260 may be formed through deposition to a thickness of, for example, about 5 nm to about 10 nm by atomic layer deposition (ALD) or chemical vapor deposition (CVD). Further, the third conductive layer 270 may be formed through deposition of, for example, metal or metal nitride with a thickness of, for example, about 50 nm to about 100 nm by atomic layer deposition (ALD), chemical vapor deposition (CVD), or physical vapor deposition (PVD).

Figure 7A:
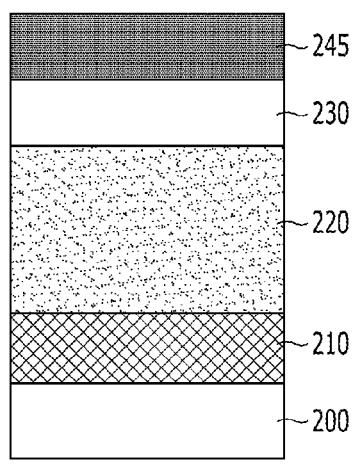
FIGS. 7A to 7D are cross-sectional views illustrating a method for fabricating a semiconductor device according to a sixth embodiment.

FIGS. 7A to 7D are cross-sectional views illustrating a method for fabricating a semiconductor device according to a sixth embodiment. In explaining this embodiment, detailed explanation on substantially the same elements as those according to the fourth embodiment as described above, will be omitted. First, after the process of FIG. 5A is performed in the same manner as the fourth embodiment, a process of FIG. 7A is performed.

Referring to FIG. 7A, after the second conductive layer 230 is formed on the second metal oxide layer 220 (or first non-stoichiometric material layer), a doped silicon layer 245 is formed on the second conductive layer 230. The second conductive layer 230 may be formed through deposition of, for example, metal, metal nitride, or a combination thereof to a thickness of, for example, about 50 nm to about 100 nm by atomic layer deposition (ALD), chemical vapor deposition (CVD), or physical vapor deposition (PVD). The doped silicon layer 115 may be formed through deposition of polysilicon doped with at least one of arsenide (As), phosphorus (P), boron (B), nitrogen (N), germanium (Ge), titanium (Ti), tantalum (Ta), etc. may be implanted with ion implantation energy of about 2 keV to about 6 keV and with high concentration, e.g., with a dose that is equal to or more than $1 \times 10^{20}$ ions/$cm^2$.

Figure 7B:
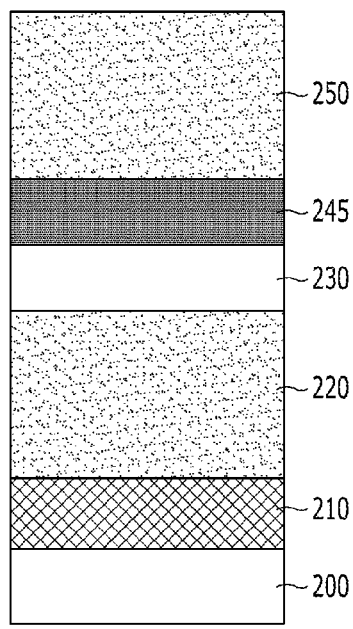

Referring to FIG. 7B, a third metal oxide layer 250 (or second non-stoichiometric material layer) is formed on the doped silicon layer 245. The third metal oxide layer 250 may include, for example, (i) a Perovskite material of which the electrical resistance is changed according to oxygen vacancy or ion movement, (ii) transition metal oxide (TMO), or (iii) a combination thereof. The third metal oxide layer 250 may be formed through deposition to a thickness of, for example, 10 nm to 50 nm by atomic layer deposition (ALD) or chemical vapor deposition (CVD), and may configured as an oxygen-deficient material.

Figure 7C:
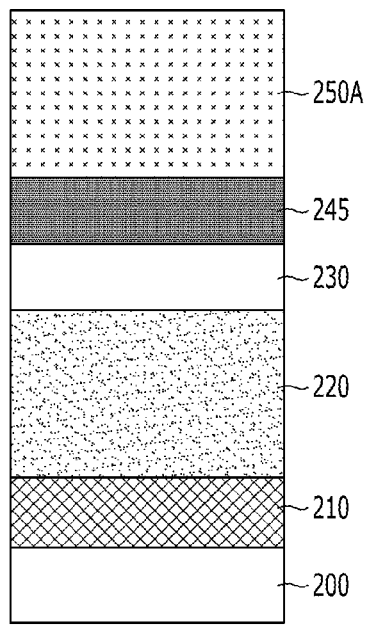

Referring to FIG. 7C, the impurity that is included in the doped silicon layer 245 is diffused into the third metal oxide layer 250. The impurity of the doped silicon layer 245 may be diffused by heat generated in the following process. In order to expedite the diffusion of the impurity, a heat treatment process may be additionally performed in nitrogen ($N_2$) atmosphere at a temperature of equal to or lower than 400° C. Since the doped silicon layer 245 has conductivity, it is not required to remove the doped silicon layer 245, and thus the process can be simplified. The third metal oxide layer 250 doped with the impurity is referred to as a third doped metal layer 250A, hereinafter.

Figure 7D:
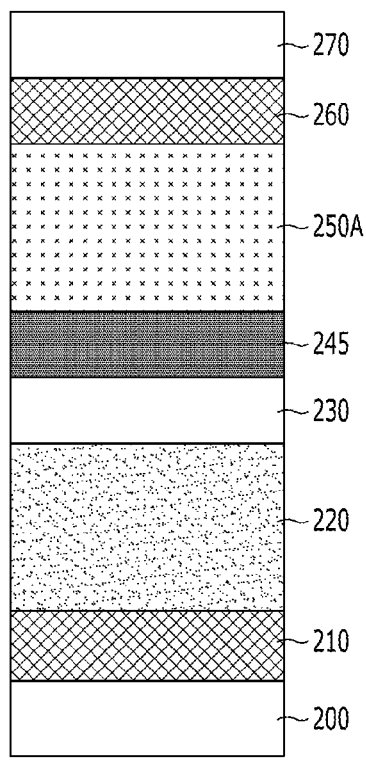

With reference to FIG. 7D, a fourth metal oxide layer 260 (or second stoichiometric material layer) and a third conductive layer 270 are sequentially formed on the third doped metal oxide layer 250A. The fourth metal oxide layer 260 may include, for example, (i) a Perovskite material, of which the electrical resistance is changed according to oxygen vacancy or ion movement, (ii) transition metal oxide (TMO), or (iii) a combination thereof. The fourth metal oxide layer 260 may be configured to satisfy a stoichiometry ratio. The fourth metal oxide layer 260 may be formed through deposition to a thickness of, for example, about 5 nm to about 10 nm by atomic layer deposition (ALD) or chemical vapor deposition (CVD). Further, the third conductive layer 270 may be formed through deposition of, for example, metal, metal nitride, or a combination thereof to a thickness of, for example, about 50 nm to about 100 nm by atomic layer deposition (ALD), chemical vapor deposition (CVD), or physical vapor deposition (PVD).

Figure 8:
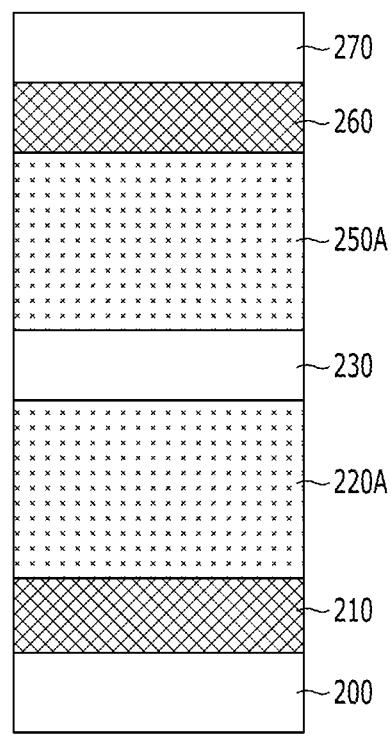
FIG. 8 is a cross-sectional view illustrating a semiconductor device according to a seventh embodiment.

FIG. 8 is a cross-sectional view illustrating a semiconductor device according to a seventh embodiment.

Referring to FIG. 8, a semiconductor device according to a seventh embodiment may have a structure in which a first conductive layer 200, a first metal oxide layer 210 (or first stoichiometric material layer), a second doped metal oxide layer 220A, a second conductive layer 230, a third doped metal oxide layer 250A, a fourth metal oxide layer 260 (or second stoichiometric material layer), and a third conductive layer 270, are sequentially stacked.

Here, the first metal oxide layer 210 and the fourth metal oxide layer 260 may include transition metal oxide (TMO) satisfying a stoichiometry ratio, and the second doped metal oxide layer 220A and the third doped metal oxide layer 250A may include an oxygen-deficient transition metal oxide (TMO) whose oxygen ratio does not satisfies its stoichiometry ratio. In particular, the second doped metal oxide layer 220A and the third doped metal oxide layer 250A may be doped with one or more impurities such as arsenide (As), phosphorus (P), boron (B), nitrogen (N), germanium (Ge), titanium (Ti), and tantalum (Ta). The first conductive layer 200, the second conductive layer 230, and the third conductive layer 270 may include, for example, metal, metal nitride, doped silicon, or a combination thereof.

Figure 9:
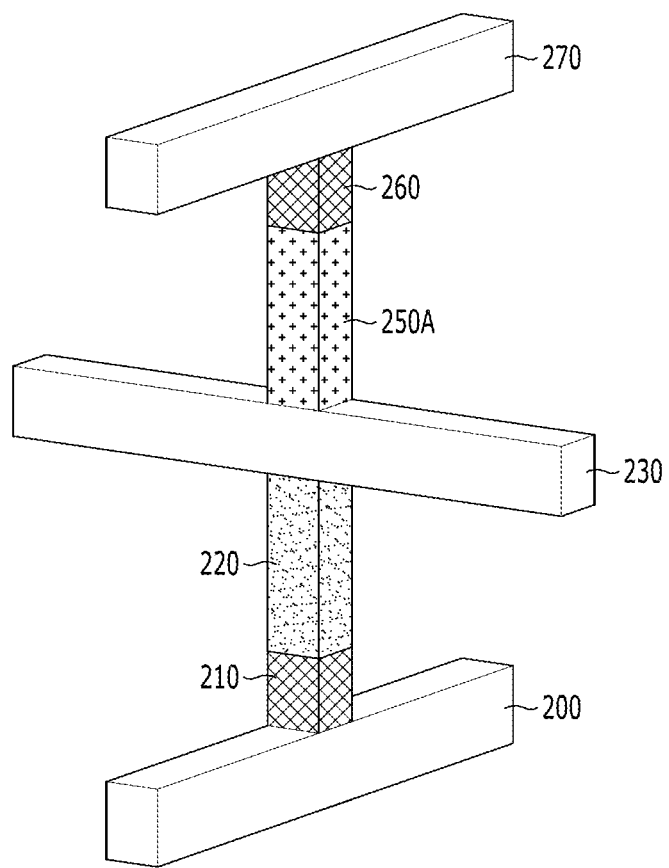
FIG. 9 is a perspective view illustrating a semiconductor device according to an embodiment.

FIG. 9 is a perspective view illustrating a semiconductor device according to an embodiment.

Referring to FIG. 9, a second conductive layer 230 of a semiconductor device according to an embodiment may extend in a first direction, and a first conductive layer 200 and a third conductive layer 270 may extend in a second direction that crosses the second conductive layer 230. A stack of first metal oxide layer 210 (or first stoichiometric material layer) and a second metal oxide layer 220 (or first non-stoichiometric material layer) may be provided between the first conductive layer 200 and the second conductive layer 230. Likewise, a third doped metal oxide layer 250A (or doped second non-stoichiometric material layer) and a fourth metal oxide layer 260 (or second stoichiometric material layer) may be provided between the second conductive layer 230 and the third conductive layer 270. The stack of the first metal oxide layer 210 and the second metal oxide layer 220 may serve as a lower variable resistance layer. Likewise, the stack of the third doped metal oxide layer 250A and the fourth metal oxide layer 260 may serve as an upper variable resistance layer. The lower variable resistance layer and the upper variable resistance layer according to an embodiment may be configured to have substantially the same switching characteristics.

A selection element may be interposed (i) between the first conductive layer 200 and the lower variable resistance layer, (ii) between the second conductive layer 230 and the lower variable resistance layer, (iii) between the second conductive layer 230 and the upper variable resistance layer, or (iv) between the third conductive layer 270 and the upper variable resistance layer. The selection element may include a transistor that can perform on/off operation or a diode through which current flows in a unidirectional manner. In addition, the selection element may include (i) an asymmetric tunnel barrier having non-linear current-voltage characteristics, (ii) an MIT (Metal-Insulator Transistor) element that is changeable between insulator and metal at specific threshold temperature to abruptly change the electrical resistance, or (iii) an ovonic switching element that can perform switching at specific threshold voltage.

Figure 12:
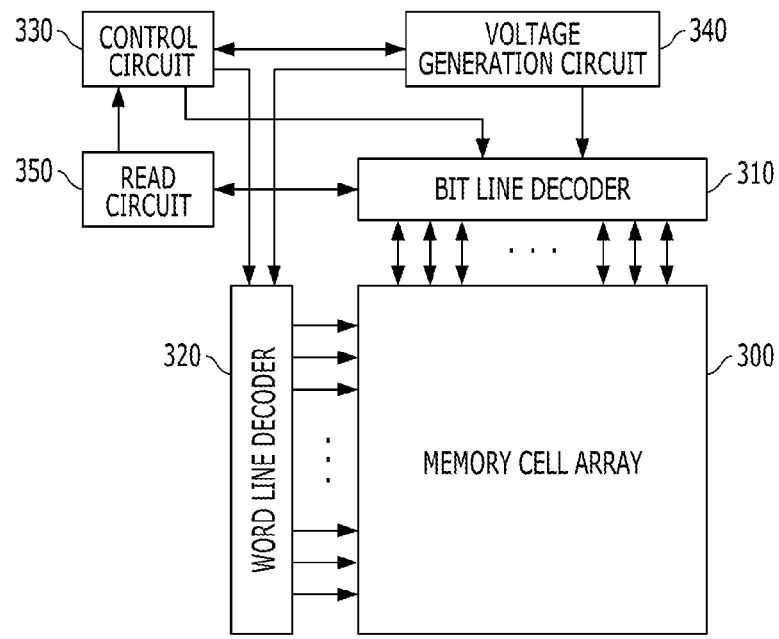
FIG. 12 is a diagram illustrating the configuration of a semiconductor device according to an embodiment.

FIG. 12 is a diagram illustrating the configuration of a semiconductor device according to an embodiment.

Referring to FIG. 12, a memory cell array 300 includes memory cells of a semiconductor device according to an embodiment, which are arranged in a matrix form. A bit line decoder 310, a word line decoder 320, a control circuit 330, a voltage generation circuit 340, and a read circuit 350 may be arranged in the neighborhood of the memory cell array 300.

The bit line decoder 310 is connected to each bit line of the memory cell array 300 to select a bit line that corresponds to an address signal. In the same manner, the word line decoder 320 is connected to each word line of the memory cell array 300 to select a word line that corresponds to an address signal. That is, a specific memory cell of the memory cell array 300 may be selected by the bit line decoder 310 and the word line decoder 320.

The control circuit 330 controls the bit line decoder 310, the word line decoder, and the voltage generation circuit 340 based on the address signal, a control input signal, and input data during write operation, and particularly controls write, erase, and read operations of the memory cell array 300. Further, the control circuit 330 may perform functions of a general address buffer circuit, a data input/output buffer circuit, and/or a control input buffer circuit.

The voltage generation circuit 340 generates voltages that are necessary during the write, erase, and read operations of the memory cell array 300, and supplies the generated voltages to the bit line and the word line. On the other hand, the read circuit 350 detects data stored a selected memory cell through sensing the resistance state of the selected memory cell, and transfers the data to the control circuit 330.

Figure 13:
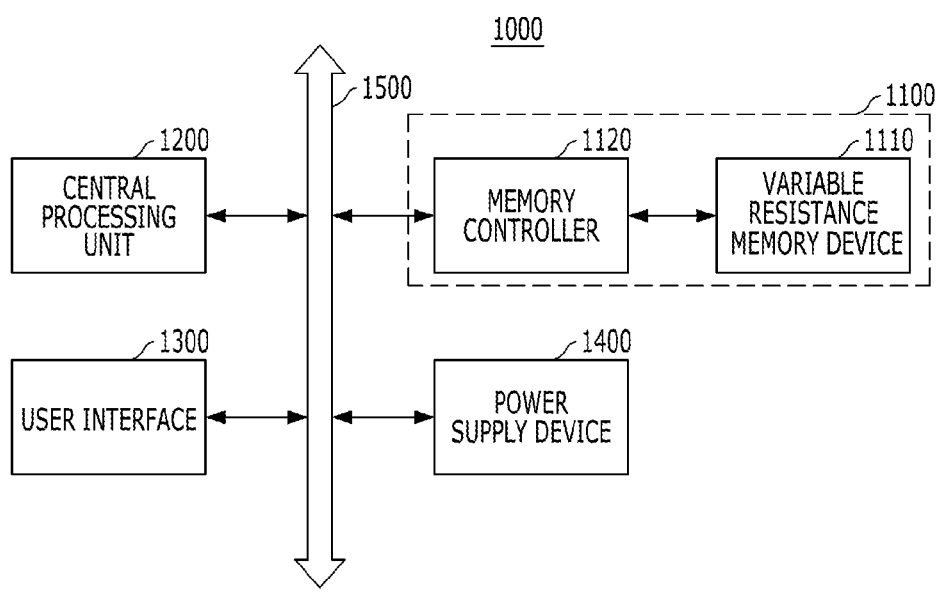
FIG. 13 is a diagram illustrating the configuration of an electronic device including a semiconductor device according to an embodiment.

FIG. 13 is a diagram illustrating the configuration of an electronic device including a semiconductor device according to an embodiment.

Referring to FIG. 13, an electronic device 1000 including a semiconductor device according to an embodiment may include a data storage system 1100, a central processing unit 1200, a user interface 1300, and a power supply device 1400 supplying power that is necessary for operations of the above-described constituent elements. The constituent elements can perform data communication with each other through a bus 1500. The electronic device 1000 is a device that can perform operations of input, processing, output, communication, and storage with respect to data. The electronic device 1000 may be a computer, a server, a tablet PC (Personal Computer), a portable computer, a PDA (Personal Digital Assistant), a wireless phone, a mobile phone, a smart phone, a digital music player, a PMP (Portable Multimedia Player), a camera, a GPS (Global Positioning System), a video camera, a voice recorder, telematics, an AV system (Audio Visual system), a smart TV (smart Television), or the like.

The data storage system 1100 may include a variable resistance memory device 1110 that can hold the stored data regardless of the power supply, and a memory controller 1120 controlling input/output of data stored in the variable resistance memory device 1110 in accordance with a command input from outside. The data storage system may be a HDD (Hard Disk Drive), a SSD (Solid State Drive), a USB (Universal Serial Bus) memory, a SD (Secure Digital) card, a mini SD (Secure Digital) card, a micro SD (Secure Digital) card, a SDHC (Secure Digital High Capacity) card, a memory stick, a CF (Compact Flash) card, a SM (Smart Media) card, a MMC (Multi-Media Card), an eMMC (Embedded MMC), or the like.

The variable resistance memory device 1110 may store data that is processed by the central processing unit 1200 or data that is input from outside through the user interface 1300, and may include any of semiconductor devices fabricated by the method according to the above-described embodiments. The memory controller 1120 may control data exchange between the variable resistance memory device 1110 and the user interface 1300 in accordance with a command analyzed by the central processing unit 1200.

The central processing unit 1200 may perform analysis of a command input through the user interface 1300, operation and comparison of data stored in the data storage system 1100. The central processing unit 1200 may include a MPU (Micro Processor Unit), a single/multi core processor, an AP (Application Processor), a GPU (Graphic Processing Unit), a DSP (Digital Signal Processor), and the like.

The user interface 1300 is to exchange commands and data between the electronic device 1000 and an external device, and may be a keypad, a keyboard, a mouse, a speaker, a microphone, various kinds of display devices, various kinds of HID (Human Interface Devices), or a communication device. The communication device may include a module that can connect to a wired network or a module that can connect to a wireless network.

Here, the module that can connect to the wired network may include a LAN (Local Area Network), a USB (Universal Serial Bus), an Ethernet, PLC (Power Line Communication), and the like. The module that can connect to the wireless network may include IrDA (Infrared Data Association), CDMA (Code Division Multiple Access), FDMA (Frequency Division Multiple Access), a wireless LAN, WiBro (Wireless Broadband Internet), USN (Ubiquitous Sensor Network), RFID (Radio Frequency Identification), NFC (Near Field Communication), Zigbee, Bluetooth, LTE (Long Term Evolution), HSDPA (High Speed Downlink Packet Access), WCDMA (Wideband CDMA), UWB (Ultra WideBand), or the like.

As described above, embodiments may prevent electrical resistance of the metal oxide layer from increasing even when the metal oxide layer is subject to oxidation during the fabrication process. This may be achieved by doping an impurity into the metal oxide layer in advance of the oxidation process.

Thus, resistive switching characteristics can be improved, and reliability and productivity of the semiconductor device can be improved.

The various embodiments are described for illustrative purposes and should not be construed as limiting.

What is claimed is:

1. A semiconductor device comprising:
a first conductive layer;
a doped silicon layer disposed over the first conductive layer;
a first metal oxide layer disposed over the doped silicon layer, the first metal oxide layer doped with an impurity diffused from the doped silicon layer, wherein the first metal oxide layer includes oxygen at a lower ratio than a stoichiometric ratio;
a second metal oxide layer disposed over the first metal oxide layer; and
a second conductive layer disposed over the second metal oxide layer,
wherein the impurity of the first metal oxide layer is the same as an impurity of the doped silicon layer.

2. The semiconductor device of claim 1, wherein concentration of the impurity in the first metal oxide layer decreases as a distance from the first conductive layer increases.

3. The semiconductor device of claim 1, wherein the second metal oxide layer satisfies a stoichiometric ratio.

4. The semiconductor device of claim 1, wherein the impurity includes at least one of arsenide, phosphorus, boron, nitrogen, germanium, titanium, and tantalum.

5. The semiconductor device of claim 1, wherein the second metal oxide layer has a resistance value higher than a resistance value of the first metal oxide layer.

6. The semiconductor device of claim 1, wherein the first conductive layer extends in a first direction, and
wherein the second conductive layer extends in a second direction that crosses the first conductive layer.

7. The semiconductor device of claim 1, wherein the doped silicon layer is disposed directly on the first metal oxide layer, and
wherein the second metal oxide layer satisfies a stoichiometric ratio.

8. The semiconductor device of claim 1, wherein the impurity includes any of arsenide, phosphorus, boron, nitrogen, germanium, tantalum, and a combination thereof.

9. A semiconductor device, comprising:
a first conductive layer;
a first metal oxide layer disposed over the first conductive layer;
a second metal oxide layer which includes oxygen at a lower ratio than a stoichiometric ratio and is disposed over the first metal oxide layer;
a second conductive layer disposed over the second metal oxide layer;
a third metal oxide layer doped with an impurity, wherein the third metal oxide layer includes oxygen at a lower ratio than a stoichiometric ratio and is disposed over the second conductive layer;
a fourth metal oxide layer disposed over the third metal oxide layer; and
a third conductive layer disposed over the fourth metal oxide layer,
wherein the first and the fourth metal oxide layers satisfy a stoichiometric ratio.

10. The semiconductor device of claim 9, wherein concentration of the impurity decreases as a distance from the second conductive layer increases.

11. The semiconductor device of claim 9, further comprising:
a doped silicon layer which is provided between the second conductive layer and the third metal oxide layer.

12. The semiconductor device of claim 9, wherein the impurity includes at least one of arsenide, phosphorus, boron, nitrogen, germanium, titanium, and tantalum.

13. The semiconductor device of claim 9, wherein the first metal oxide layer has a resistance value that is higher than a resistance value of the second metal oxide layer, and
wherein the fourth metal oxide layer has a resistance value that is higher than a resistance value of the third metal oxide layer.

14. The semiconductor device of claim 9, wherein the second conductive layer extends in a first direction, and
wherein the first and the third conductive layers extend in a second direction that crosses the second conductive layer.

15. The semiconductor device of claim 9, wherein the second metal oxide layer is doped with an impurity.

16. A semiconductor device, comprising:
a first electrode layer;
a doped silicon layer disposed over the first electrode layer;
a non-stoichiometric material layer which is doped with an impurity diffused from the doped silicon layer and is disposed over the doped silicon layer;
a stoichiometric material layer disposed over the non-stoichiometric material layer; and
a second electrode layer disposed over the stoichiometric material layer,
wherein the impurity of the non-stoichiometric material layer is the same as an impurity of the doped silicon layer.

17. The semiconductor device of claim 16,
wherein a resistance value of the stoichiometric material layer is higher than a resistance value of the non-stoichiometric material layer.

18. The semiconductor device of claim 16, wherein each of the non-stoichiometric material layer and the stoichiometric material layer includes (i) a Perovskite material, (ii) a transition metal oxide (TMO), or (iii) both, and
wherein the transition metal oxide (TMO) includes titanium (Ti) oxide, hafnium (Hf) oxide, zirconium (Zr) oxide, aluminum (Al) oxide, tantalum (Ta) oxide, niobium (Nb) oxide, cobalt (Co) oxide, nickel (Ni) oxide, tungsten (W) oxide, and lanthanum (La) oxide, or a combination thereof.

* * * * *